United States Patent [19]
Brotherton et al.

[11] Patent Number: 5,508,555
[45] Date of Patent: Apr. 16, 1996

[54] THIN FILM FIELD EFFECT TRANSISTOR HAVING A DOPED SUB-CHANNEL REGION

[75] Inventors: Stanley D. Brotherton, Forest Row; John R. A. Ayres, Crawley, both of England

[73] Assignee: U.S. Philips Corporation, New York, N.Y.

[21] Appl. No.: 483,008

[22] Filed: Jun. 6, 1995

Related U.S. Application Data

[63] Continuation of Ser. No. 875,007, Apr. 24, 1992, abandoned, which is a continuation of Ser. No. 536,901, Jun. 12, 1990, abandoned.

[30] Foreign Application Priority Data

Jul. 12, 1989 [GB] United Kingdom .................... 8915951

[51] Int. Cl.$^6$ .......................... H01L 29/00; H01L 29/78; H01L 29/34
[52] U.S. Cl. ............... 257/650; 257/9; 257/221; 257/652
[58] Field of Search ................... 357/23, 4, 23.1; 257/9, 221, 650, 652

[56] References Cited

U.S. PATENT DOCUMENTS

| | | | |
|---|---|---|---|
| 3,958,266 | 5/1976 | Athanas | 357/23 |
| 4,199,773 | 4/1980 | Goodman et al. | 357/23 |
| 4,496,963 | 1/1985 | Dunkley et al. | 357/22 |
| 5,021,843 | 6/1991 | Ohmi | 357/23.1 |
| 5,031,008 | 7/1991 | Yoshida | 357/23.1 |
| 5,040,037 | 8/1991 | Yamaguchi et al. | 357/23.1 |
| 5,055,895 | 10/1991 | Akiyama et al. | 357/23.4 |

FOREIGN PATENT DOCUMENTS

| | | | |
|---|---|---|---|
| 55-148464 | 11/1980 | Japan | 357/23 R |
| 61-22669 | 1/1986 | Japan . | |
| 1-241854 | 9/1989 | Japan | 357/23.1 |

OTHER PUBLICATIONS

Rodder et al., "Hot–Carrier Effects in Hydrogen Passivated p–Channel Polycrystalline–Si MOSFET's," IEEE Trans. on Electron Devices vol. ED–34 No. 5, May 1987.

J. G. Fossum et al, "Anomalous Leakage Current in LPCVD Polysilicon MOSFET's", IEEE Transactions on Electron Devices, vol. ED–32, No. 9, Sep. 1985, pp. 1878–1884.

*Primary Examiner*—Sara W. Crane
*Assistant Examiner*—Valencia Martin Wallace
*Attorney, Agent, or Firm*—Norman N. Spain

[57] ABSTRACT

A thin film field effect transistor (1) is formed by an insulating substrate (2,3) carrying a semiconductor layer (4) having a polycrystalline channel region (5) which is passivated to reduce the density of charge carrier traps. Source and drain electrodes (6 and 7) contact opposite ends (5a,5b) of the channel region (5), and a gate electrode (8) is provided at one major surface (4a) of the semiconductor layer (4) for controlling a conduction channel of one conductivity type in the polycrystalline channel region (5) to provide a gateable connection between the source and drain electrodes (6 and 7). An area (50) of the polycrystalline channel region (5) spaced from the electrodes (6,7,8) of the transistor (1) and lying adjacent to the other major surface (4b) of the semiconductor layer (4) is doped with impurities of the opposite conductivity type for suppressing formation of a conduction channel of the one conductivity type adjacent to the other major surface (4b).

6 Claims, 1 Drawing Sheet

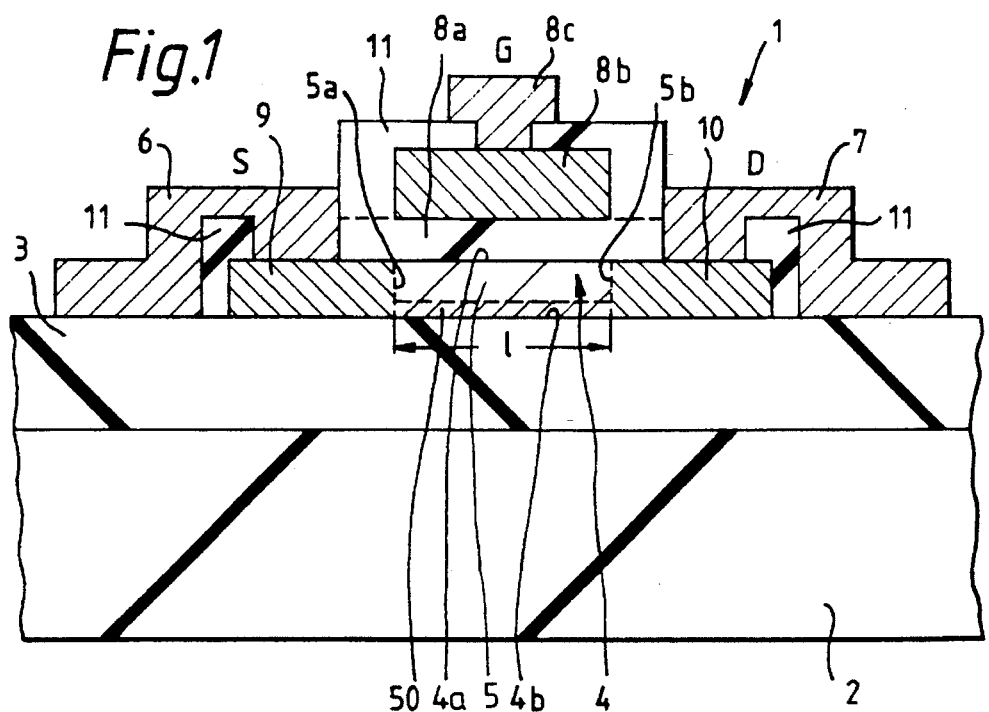
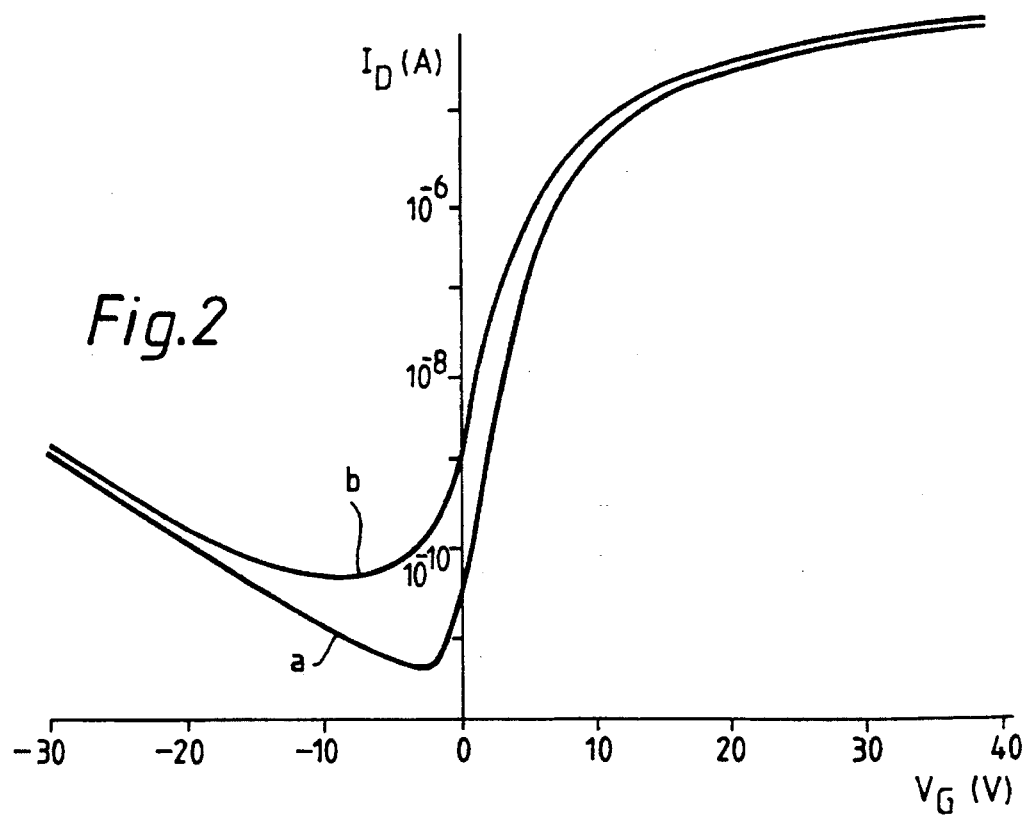

THIN FILM FIELD EFFECT TRANSISTOR HAVING A DOPED SUB-CHANNEL REGION

This is a continuation of application Ser. No. 07/875,007, filed Apr. 24, 1992 now abandoned which is a continuation of Sr. No. 536,901, filed Jun. 12, 1990 now abandoned.

This invention relates to a thin film field effect transistor and to a method of manufacturing such a transistor.

European patent application EP-A-299185 describes thin film field effect transistors comprising an insulating substrate carrying a semiconductor layer having a polycrystalline channel region which is passivated to reduce the density of charge carrier traps, source and drain electrodes contacting opposite ends of the channel region and a gate electrode provided at one major surface of the semiconductor layer for controlling a conduction channel of one conductivity type in the polycrystalline channel region to provide a gateable connection between the source and drain regions.

In addition to the source, drain and gate electrodes mentioned above, the thin film field effect transistors described in EP-A-299185 have a further or bias control electrode which makes a rectifying contact with the other major surface of the semiconductor layer, opposite the gate electrode, via a Schottky barrier or pn junction to enable a bias voltage to be applied to the rear surface of the channel region to allow the gate threshold voltage to be adjusted as desired.

EP-A-299185 describes two alternative structures, one in which the gate electrode is located between the insulating substrate and the channel region and the other in which the bias control electrode is located between the insulating substrate and the channel region. In both structures, it is necessary for electrical contact to be made to the electrode provided on the insulating substrate. This requires additional process steps, in particular the deposition and patterning of a conductive layer on the insulating substrate to enable electrical contact to the bias control electrode or gate electrode, as the case may be. In the example where the bias control electrode is provided on the insulating substrate then it is also necessary to ensure that the metallization pattern is correctly aligned with the pn junction or Schottky barrier forming the rectifying contact.

According to one aspect of the present invention, there is provided a thin film field effect transistor, comprising an insulating substrate carrying a semiconductor layer having a polycrystalline channel region which is passivated to reduce the density of charge carrier traps, source and drain electrodes contacting opposite ends of the channel region, and a gate electrode provided at one major surface of the semiconductor layer for controlling a conduction channel of one conductivity type in the polycrystalline channel region to provide a gateable connection between the source and drain regions, characterised in that an area of the polycrystalline channel region spaced from the electrodes of the transistor and lying adjacent to the other major surface of the semiconductor layer is doped with impurities of the opposite conductivity type for supressing formation of a conduction channel of the one conductivity type adjacent to the other major surface.

According to another aspect of the present invention, there is provided a method of manufacturing a thin film field effect transistor, which method comprises depositing a semiconductor layer for forming a polycrystalline channel region on an insulating substrate, providing source and drain electrodes contacting opposite ends of the channel region, defining a gate electrode at one major surface of the semiconductor body for controlling a conduction channel of the one conductivity type in the polycrystalline channel region to provide a gateable connection between the source and drain electrodes and passivating the channel region so as to reduce the density of charge carrier traps, characterised by doping an area of the polycrystalline channel region spaced from the electrodes of the transistor and lying adjacent to the other major surface of the semidonductor body with impurities of the opposite conductivity type for suppressing formation of a conduction channel of the one conductivity type adjacent to the other major surface.

In a transistor embodying the invention, the doped area serves to inhibit the formation of a channel of the one conductivity type adjacent to the other major surface of the polycrystalline channel region so as to assist in reducing bulk leakage current while avoiding the necessity to provide an electrical contact to the other major surface of the semiconductor body. This is of particular advantage where the other major surface is adjacent to the insulating layer as it avoids the complex and costly additional processing steps which would otherwise be necessary.

Preferably, the semiconductor layer comprises polycrystalline silicon and the channel region is passivated with hydrogen, for example by prolonged exposure to a hydrogen plasma at about 350 degrees Celsius. The polycrystalline silicon layer may be deposited as polycrystalline silicon or may, for example, be deposited as amorphous silicon and then annealed. This hydrogen passivation, which is normally the last stage of the process, results in trapping state passivation at the grain boundaries in the polycrystalline silicon and in addition serves to reduce the device leakage current because, it is believed, the hydrogen passivation results in an increased free carrier lifetime. The inventors have found that in spite of the hydrogen passivation of polycrystalline silicon the leakage current at the other major surface, that is the interface opposite the gate electrode, is still significant, but that the provision of the doped area in accordance with the invention serves to suppress any conduction channel of the one conductivity type at that interface, thereby reducing the residual leakage current.

In order to facilitate ohmic contact to the source and drain electrodes, each end of the polycrystalline channel region is normally provided with a highly doped contact region of the one conductivity type. The two highly doped contact regions may each form a pn junction with the doped area without any significant risk of parasitic bipolar transistor action because the area of the pn junctions will be small compared to the length of the polycrystalline channel region (and thus the length of the doped area which preferably extends along the entire length of the channel region) and because the diffusion length of charge carriers along the doped area will be very small compared to the channel length. As the doped area may form pn junctions with any such highly doped contact regions, the doped area may be formed simply by a blanket of deep ions, for example boron, implantated without the necessity for any additional masking steps.

It should be noted that, for example, U.S. Pat. No. 4,199,773 describes a silicon-on-insulator, in particular a silicon-on-sapphire, insulated gate field effect transistor in which the channel region is formed by deposition of a layer of monocrystalline silicon on the surface of the sapphire body and in which the leakage current attributable to 'back channel' leakage is minimized by forming the channel region in such a manner so as to have two levels of dopant concentration with the highest level adjacent the monocrystalline silicon-sapphire interface. However, as will be appreciated by those skilled in the art, the properties of a monocrystalline silicon layer provided on a sapphire body are considerably different from those of a polycrystalline semiconductor layer (even a polycrystalline silicon layer) which has been passivated to reduce the density of charge carrier traps.

Embodiments of the invention will now be described, by way of example, with reference to the accompanying drawings, in which:

FIG. 1 is a very schematic cross-sectional view of a thin film field effect transistor in accordance with the invention; and FIG. 2 illustrates graphically the difference in leakage currents of a conventional thin film field effect transistor and a thin film field effect transistor in accordance with the invention.

It should of course be understood that FIG. 1, in particular, is not drawn to scale and that certain dimensions may have been exaggerated or reduced in the interests of clarity.

Referring now to FIG. 1, there is shown a thin film field effect transistor 1. It should be appreciated that FIG. 1 is merely diagrammatic and illustrates only schematically the contours of the various layers forming the transistor. The transistor comprises an insulating substrate 2,3 carrying a semiconductor layer 4 having a polycrystalline channel region 5 which is passivated to reduce the density of charge carrier traps, source and drain electrodes 6 and 7 contacting opposite ends 5a,5b of the channel region 5, and a gate electrode made up to elements 8a 8b 8c provided at one major surface 4a of the semiconductor layer 4 for controlling a conduction channel of one conductivity type, in this example n conductivity type, in the polycrystalline channel region 5 to provide a gateable connection between the source and drain electrodes 6 and 7.

In accordance with the invention, an area 50 of the polycrystalline channel region 5 spaced from the electrodes 6,7,8 of the transistor 1 and lying adjacent to the other major surface 4b of the semiconductor layer 4 is doped with impurities of the opposite conductivity type, p type in this example, for suppressing formation of a conduction channel of the one conductivity type adjacent to the other major surface 4b. Generally, as shown in FIG. 1, the doped area 50 extends along the entire length 1 of the polycrystalline channel region 5.

Referring now more specifically to the transistor 1 shown in FIG. 1, the insulating substrate comprises a base 2 formed of a glass capable of withstanding temperatures of up to 650 degrees Celsius, for example Hoya NA40, Corning 1733 or Asahi AN, onto which is provided a layer of silicon dioxide 3.

The semiconductor layer 4 is provided, in this example, directly onto the silicon dioxide layer 3 as a layer of undoped or intrinsic polycrystalline silicon. The lower surface 4b of the polycrystalline silicon layer 4 (that is the surface forming an interface with the silicon dioxide layer 3) is doped with p type impurities, for example boron, to form the doped area 50. The semiconductor layer is provided with highly doped n conductivity type source and drain contact regions 9,10 contacting opposite ends 5a,5b of the channel region 5 defined by the polycrystalline silicon layer 4 to facilitate ohmic contact to the source and drain electrodes 6 and 7 which, in this example, are formed of aluminum.

As can clearly be seen from FIG. 1, the gate electrode comprises an insulated gate having a thin insulating layer 8a which is formed in this example of silicon dioxide although other insulating materials, for example silicon nitride, could be used and an overlying conductive gate layer 8b formed in this example of n conductivity type polycrystalline silicon. A capping insulating layer 11, again for example formed of silicon dioxide, may be provided over the polycrystalline silicon layer 4 and conductive gate layer 8b. Windows opened in the capping insulating layer 11 enable the source and drain electrodes 6 and 7 to contact the contact regions and enable a gate electrode contact 8c to contact the conductive gate layer 8b.

A method of manufacturing the thin film field effect transistor 1 shown in FIG. 1 will now be briefly described assuming that the silicon dioxide layer 3 has already been provided on the glass base 2 by suitable conventional means, for example chemical vapor phase deposition.

Thus, first, the polycrystalline silicon layer 4 is formed by a low pressure (for example 140 mTorr) chemical vapor depositon process using silane at a temperature of about 620 degrees Celsius to result in a polycrystalline silicon layer 4 of about 0.2 micrometers thickness with a columnar structure and a mean grain size of the order of 700 Angstroms.

After deposition of the desired thickness of polycrystalline silicon, boron ions are implanted into the polycrystalline silicon using an energy of about 50 keV and a dose of about $5 \times 10^{12}$ atoms $cm^{-2}$ to form the doped area 50 adjacent to the interface 4b with the silicon dioxide substrate layer 3. The process is very tolerant of changes in dose and energy with similar results being obtained at an implantation energy of 60 keV and dose of $1 \times 10^{13} cm^{-2}$. The polycrystalline silicon layer 4 is then defined to form the island region shown in FIG. 1. It will, of course, be appreciated that, while FIG. 1 shows only one thin film field effect transistor, normally many such transistors will be formed simultaneously on the substrate and interconnected as desired, for example, to form the switching devices of a liquid crystal display, in a conventional manner.

If desired, the boron ion implantation step may be carried out after definition of the polycrystalline silicon island. A layer of silicon dioxide with a thickness of about 0.15 micrometers is then deposited using an atmospheric pressure chemical vapor deposition technique at about 400 degrees Celsius so as to cover the polycrystalline silicon island 4 and so as to form the gate oxide layer 8a. Alternatively the gate oxide layer 8a may be formed by thermal oxidation of the polycrystalline silicon layer 4.

A polycrystalline silicon layer is then deposited at low pressure in a manner similar to that described above and patterned to define the shape of the conductive gate layer 8b. The gate layer 8b is, however, still undoped at this stage.

The gate layer 8b and contact regions 9 and 10 are then doped by, for example, implantation of phosphorus ions, using the gate oxide layer 8a as a mask. The structure is then heated in nitrogen to activate the implanted impurities and anneal any implantation damage.

The capping layer 11 of silicon dioxide may then be deposited and contact windows opened using conventional photolithographic and etching processes. Aluminum is then deposited to a thickness of about 1 micrometer and patterned to define the source and drain electrodes 6 and 7 and the gate contact 8c.

A plasma hydrogenation process is then carried out. Typically, the plasma hydrogenation process is carried out in an inductively coupled plasma processing system. The process, conditions and duration of the plasma hydrogenation process are such as to enable hydrogen to diffuse as far as the lower surface 4b.

The hydrogenation process results in passivation of charge carrier traps at the grain boundaries within the polycrystalline silicon channel region 5 and also at the interface 4b between the polycrystalline silicon channel region 5 and the silicon dioxide substrate layer 3. In addition, the plasma hydrogenation reduces the device leakage current because, it is believed, of the increase in free charge carrier lifetime arising from the passivation of the charge carrier traps.

FIG. 2 illustrates graphically the change in drain current ($I_D$) with voltage ($V_G$) applied to the gate contact 8c for a thin film field effect transistor in accordance with the invention in the dark (curve a). A comparable curve b is shown for a conventional thin film field effect transistor with a structure similar to that of FIG. 1 but formed without the doped area 50. In each case a voltage ($V_D$) of 5 volts is applied to the drain electrode with the source electrode at 0 v and in each case the ratio of the width:length of the channel region 5 is 50:6.

As can be seen from a comparison of curves a and b, with zero volts applied to the gate contact 8c the leakage current $I_D$ for the transistor shown in FIG. 1 is less than $10^{-10}$A while that of the conventional transistor is about $10^{-9}$A.

A thin film field effect transistor of the type described above thus enables the advantages of passivated polycrystalline silicon, for example the high mobility and relatively low photoconductivity, to be retained while enabling the residual leakage current to be suppressed without the need for a bias control electrode which would increase the cost and complexity of processing, particularly for the coplanar type of structure (that is where the source, gate and drain electrodes are all on the same side of the channel region) shown in FIG. 1 where no metallization pattern is required on the insulating substrate 2,3.

Although the transistor shown in FIG. 1 is of the coplanar type of structure, the present invention may be applied to a staggered (source and drain electrodes on the opposite side of the channel region to the gate electrode) type of structure or to the inverted (gate on the substrate) types of these two structures. Furthermore, although the present invention has particular advantages where the channel region is formed of polycrystalline silicon, it may also be of advantage where the channel region is formed of other polycrystalline semiconductors.

From reading the present disclosure, modifications or variations will be apparent to persons skilled in the semiconductor art and which may be used instead of or in addition to features already described herein. Although claims have been formulated in this application to particular combinations of features, it should be understood that the scope of the disclosure of the present combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A thin film field effect transistor comprising
   (a) an insulating substrate,
   (b) a polycrystalline semiconductor layer disposed on said insulating substrate,
   (c) a channel region disposed in said polycrystalline semiconductor layer, said channel region forming a conduction channel of a first conductivity type,
   (d) a gate electrode structure disposed on said channel region,
   (e) source and drain electrode structures disposed at opposite sides of said gate electrode structure and at opposite ends of said channel region, and
   (f) layer means disposed in said polycrystalline semiconductor layer between said insulating substrate and said channel region and extending between said source and drain electrode structures for suppressing formation of said conduction channel of said first conductivity type at said insulating substrate, said layer means being doped with impurities of a second conductivity type to reduce leakage current at said insulating substrate.

2. A thin film field effect transistor as claimed in claim 1, wherein said polycrystalline semiconductor layer is polycrystalline silicon.

3. A thin film field effect transistor as claimed in claim 2, wherein said layer means is polycrystalline silicon doped with boron.

4. A thin film field effect transistor according to claim 3, wherein said channel region is polycrystalline silicon passivated with hydrogen.

5. A thin film field effect transistor as claimed in claim 4, wherein highly doped contact regions are disposed at each end of said channel region to provide an ohmic contact respectively with said source electrode structure and said drain electrode structure.

6. A thin film field effect transistor comprising
   (a) an insulating glass substrate,
   (b) a polycrystalline silicon layer disposed on said glass substrate,
   (c) an intrinsic channel region disposed in said polycrystalline silicon layer, said channel region being passivated with hydrogen and providing a conduction channel of a first conductivity type,
   (d) an insulated gate electrode structure disposed on said channel region,
   (e) source and drain electrode structures disposed at opposite sides of said insulated gate electrode structure and at opposite ends of said channel region, and
   (f) a layer doped with impurities of a second conductivity type and extending in said polycrystalline silicon layer between the source and drain electrodes, said layer separating said glass substrate from said channel region to suppress formation of said conduction channel of said first conductivity type adjacent to said glass substrate in order to reduce leakage currents at said glass substrate.

* * * * *